United States Patent [19]

Nomura et al.

[11] Patent Number: 4,698,503
[45] Date of Patent: Oct. 6, 1987

[54] FOCUSING APPARATUS USED IN A TRANSMISSION ELECTRON MICROSCOPE

[75] Inventors: Setsuo Nomura, Tokyo; Morioki Kubozoe; Shigeto Isakozawa, both of Katsuta, all of Japan

[73] Assignee: Hitachi, Ltd., Tokyo, Japan

[21] Appl. No.: 821,454

[22] Filed: Jan. 22, 1986

[30] Foreign Application Priority Data

Jan. 23, 1985 [JP] Japan ................................. 60-8975

[51] Int. Cl.$^4$ ............................................. H01J 37/26
[52] U.S. Cl. ..................................... 250/311; 250/397
[58] Field of Search ..................... 250/311, 396, 397; 313/361.1

[56] References Cited

U.S. PATENT DOCUMENTS

| | | | |
|---|---|---|---|
| 3,833,811 | 9/1974 | Koike et al. | 250/311 |
| 3,908,124 | 9/1975 | Rose | 250/311 |
| 4,097,740 | 6/1978 | Muller et al. | 250/397 |
| 4,169,240 | 9/1979 | Anderson et al. | 250/396 R |
| 4,283,627 | 8/1981 | Isakozawa et al. | 250/311 |
| 4,494,005 | 1/1985 | Shibata et al. | 250/397 |
| 4,514,634 | 4/1985 | Lawson | 250/397 |

Primary Examiner—Bruce C. Anderson
Attorney, Agent, or Firm—Antonelli, Terry & Wands

[57] ABSTRACT

A focus control system used in a transmission electron microscope includes an electron lens for imaging the electron beam transmitted through a specimen onto the imaging plate, apparatus for deflecting the electron beam irradiation angle, and several electron beam sensors disposed of the imaging plane. Output signals produced by each sensor at two irradiation angles are integrated and stored in the memory separately. The difference between each pair of integrated values in the memory is calculated, and all differences for all sensor output pairs are summed up. The lens current of the electron lens is controlled so that the summed output is a minimum value.

6 Claims, 3 Drawing Figures

FOCUSING APPARATUS USED IN A TRANSMISSION ELECTRON MICROSCOPE

BACKGROUND OF THE INVENTION

This invention relates to a focusing apparatus used in a transmission electron microscope.

As a focusing device in a transmission electron microscope, there has been used a "wobbler". The wobbler is designed to vary the tilting angle of the irradiation electron beam on the specimen at a proper frequency using a deflection coil so that a magnified image on the imaging plane swings if the electron beam is not focused finely on the specimen. The microscope observer conducts the focus adjustment by operating the wobbler so that the swing of the image vanishes. This focusing method is widely used because of its simplicity. However, it requires of the naked eye to detect a swinging image, which is difficult for a dark image, and depends much on the effort of the observer.

With the intention of overcoming the above-mentioned problems, there has been proposed a focusing system as disclosed in Japanese Patent Examined Publication No. 49-22575, in which several electron beam sensors are arranged on the imaging plane and a swing of image caused by the wobbler operation is detected electrically by summing the absolute values of output deviations produced by the sensors. This electrical focus adjustment system negates the need for the detection of a swinging image by the naked eye to some extent, but has a drawback of inaccurate focusing due to inferior signal S/N property. The system operates to deflect the irradiation electron beam periodically so as to sample the sensor output signals, and in order to obtain noise-free output signals each electron beam sensor is followed by a narrow bandpass filter which admits only a component of frequency equal to the electron beam deflection frequency. The sensor output signal, however, includes not only the fundamental frequency pertaining to the swing of image but also many frequencies caused by the spatial frequencies of the pattern of image. Using only the fundamental frequency makes the net signal amplitude smaller and does not much improve the S/N property, particularly for a specimen image produced by a weak electron beam, and therefore accurate focusing is not achieved. Moreover, the above-mentioned electrical focusing system estimates the fineness of focus in terms of the sum of the absolute values of sensor output deviations, providing little difference of evaluated values between in-focus and out-focus conditions of a low-contrast specimen having smaller variation in concentration, and therefore accurate focusing is not achieved.

SUMMARY OF THE INVENTION

An object of this invention is to provide a focusing apparatus used in a transmission electron microscope operable to deal with the electron beam sensor output signals at discrete irradiation angles in a high S/N condition, and consequently capable of accurate focusing for the microscope.

In order to achieve the above object, the inventive focusing apparatus used in a transmission electron microscope includes an electron lens means for imaging an electron beam which has transmitted through a specimen, a plurality of electron beam sensors arranged on the imaging plane of the electron lens means, a deflection means which deflects the electron beam by a certain amount of angle for a certain duration at least once in each of two directions in response to a change in the lens current of the electron lens means, integration means which integrate the output signals of the electron beam sensors at each deflection angle for a certain time length, a memory means for storing integrated values produced by the integration means separately for each deflection angle and for each sensor, arithmetic means for calculating the difference of integrated values stored in the memory means and derived from each sensor at two difflection angles and summing differences for all sensors, and a lens current control means which controls the lens current of the electron lens means so that the output of the arithmetic means becomes minimum. The operation takes place such that the irradiation electron beam is deflected in two directions at least once each time the lens current is varied, with the sensor outputs in each deflected beam condition being integrated for a short period. Integrated values are stored in registers provided separately for two deflection angles and for all sensors. The inventive focusing apparatus uses a criterion function for estimating the fineness of focusing which provides a large difference of values between in-focus and out-focus conditions even for a low-contrast specimen.

DESCRIPTION OF THE PREFERRED EMBODIMENTS

Figure 1:
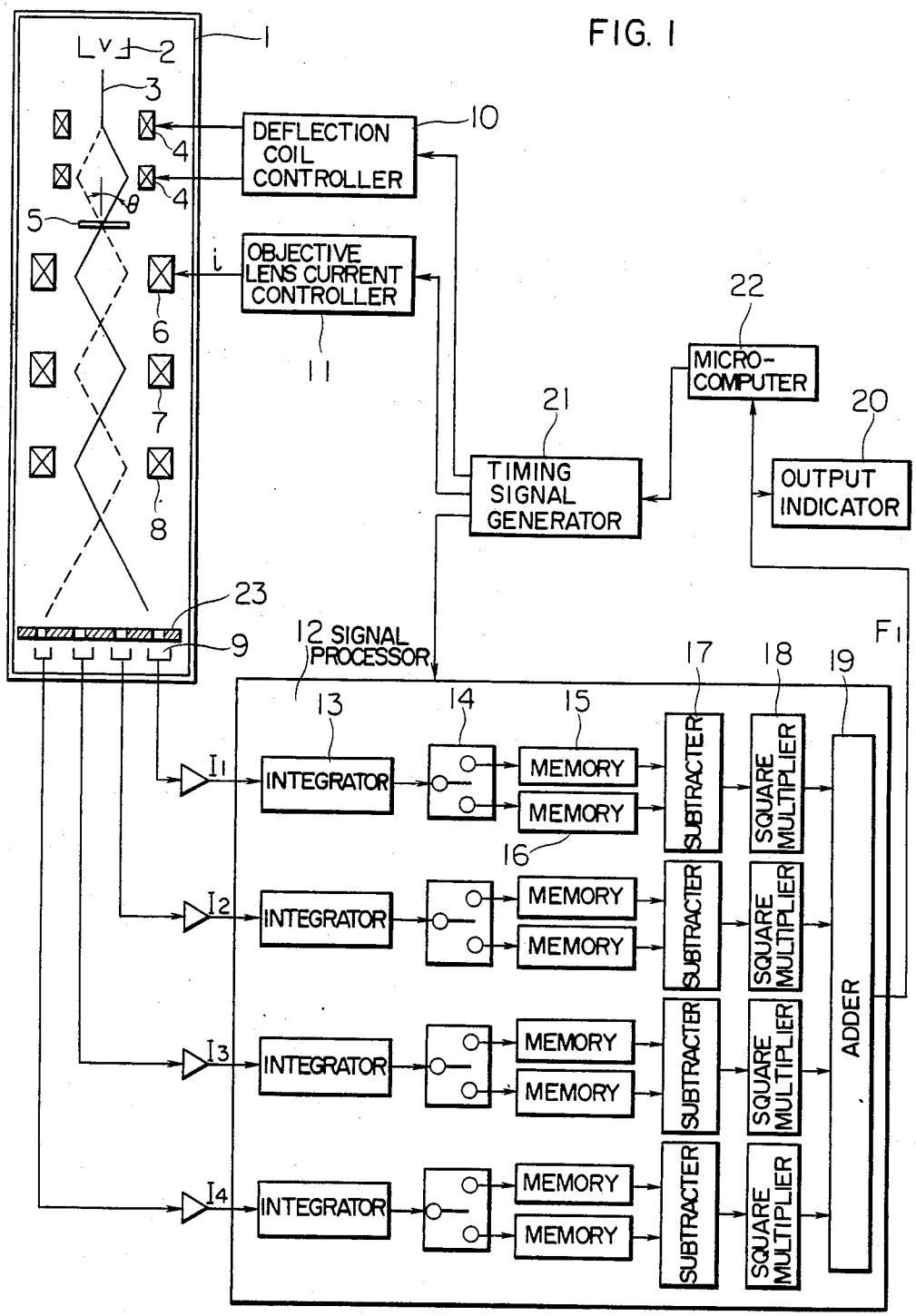
FIG. 1 is a block diagram showing an embodiment of the focusing apparatus used in a transmission electron microscope according to this invention.

Embodiments of the present invention will now be described in detail. FIG. 1 shows an embodiment of this invention, in which is used a shielding plate 23 having small apertures each confronting a Faraday cage of electron beam sensor arrangement. The principle of an the inventive focusing method is that when the image of a specimen is out of focus, it moves on the imaging plane in response to a change in the irradiation direction of the electron beam, and the swing of the image is detected by electron beam sensors having small apertures opening on the imaging plane.

In FIG. 1, when a microcomputer 22 issues a command to set the objective lens current i to a certain value, deflection coils 4 deflect the electron beam so that it irradiates a specimen 5 at an angle of $\theta$ as shown by the solid line in the figure. The electron beam transmitted through the specimen is expanded by an objective lens 6, an intermediate lens 7 and a projection lens 8, and projected onto the imaging plane where the electron beam sensors 9 with small apertures are located. Four electron beam sensors are used in this embodiment. Each sensor produces an output signal $I_k$ ($k=1, 2, 3$ or $4$ in this embodiment), which is led into a signal processor 12 and integrated for a certain time length $t_o$ by an integrator 13. The electron beam is fixed to the angle $\theta$ during the integrating operation, and the image stays still. By the integration process, the variation of the signal $I_k$, i.e., a noise component, is averaged out, and a signal having a good S/N property, e.g., with a standard deviation of 1% or less, is obtained in the case of an electron beam density on the imaging plane of $10^{-11}$A/cm$^2$, a shielding plate aperture diameter of 0.8 mm, and an integration period of 30 ms. The integrated signal is fed through a switch 14 and stored in a memory A 15.

Subsequently, the deflection coils 4 are operated by a timing signal generator 21 so that the electron beam irradiates the specimen 5 at an angle of $-\theta$. The sensor output signal $I_k$ is integrated for the same time length $t_o$, and the integrated signal is stored in another memory B 16. By the above operations the memory A and B now have contents $S_{A,K}$ and $S_{B,K}$, respectively. A subtracter 17 receives the memory outputs to calculate $|S_{A,K}-S_{B,K}|$ and supplies the result to a square multiplier 18. The outputs of four square multipliers 18 are added by an adder 19, which provides the following output.

$$F_1 = \sum_{k=1}^{4} (S_{A,K} - S_{B,K})^2 \quad (1)$$

The value $F_1$ is a focus criterion function, representing the fineness of focusing for the specimen image. When the electron beam is finely focused, a change in the electron beam irradiation angle from $+\theta$ to $-\theta$ does not cause the image to swing, resulting in a substantially equal $S_{A,K}$ and $S_{B,K}$ for all sensors, and in this case the criterion function $F_1$ takes an extremely small value (zero in the absence of the noise). The value of $F_1$ against various values of objective lens current i is plotted on the graph of FIG. 2. The $F_1$ takes a minimum value at current $i_o$ which provides the finest focusing of the objective lens, and accordingly the electron microscope can be focused by setting the objective lens current i to $i_o$.

Figure 2:
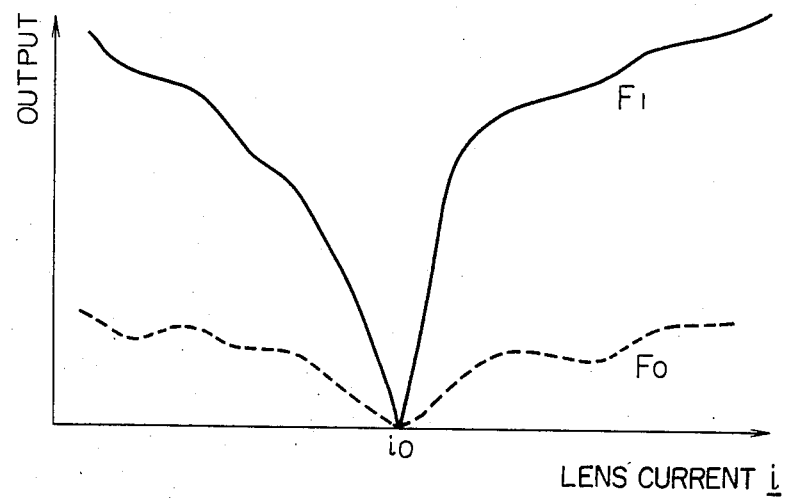
FIG. 2 is a graph showing the relationship between the objective lens current and the output of the signal processor shown in FIG. 1.

The graph of FIG. 2 includes by the dashed curve a plot of another focus criterion function with is evaluated by the signal processor shown in FIG. 1 excluding the square multipliers 18 and is expressed as follows.

$$F_0 = \sum_{k=1}^{4} |S_{A,K} - S_{B,K}| \quad (2)$$

This criterion function $F_o$ does not present a sharp fall at a fine focus condition as compared with the $F_1$, and therefore will not achieve accurate focusing for a low-contrast image. Conversely, use of multipliers calculating a larger even multiple of the power in place of the square multipliers 18 will achieve more accurate detection of the in-focus condition.

Figure 3:
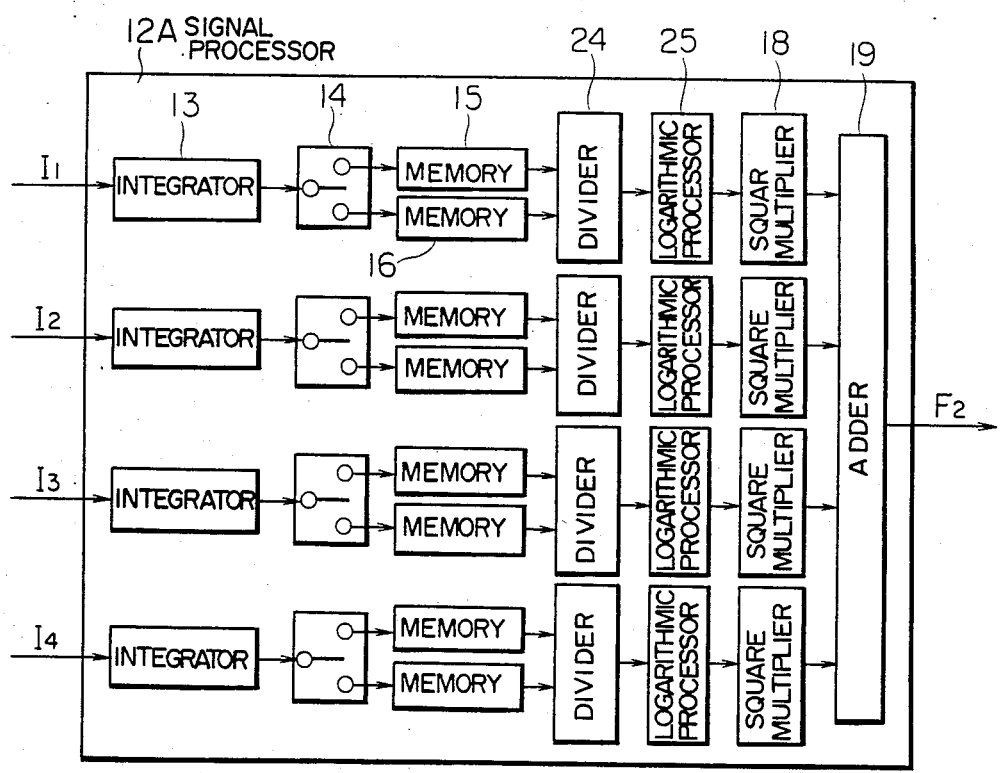
FIG. 3 is a block diagram showing another embodiment of the signal processor.

FIG. 3 shows another embodiment of the signal processor 12. In this arrangement, a set of integrated signals $S_{A,K}$ and $S_{B,K}$ for two irradiation angles is processed by a divider 24 and then by a logarithmic processor 25 so that a value of log($S_{A,K}/S_{B,K}$) is calculated. The result is squared by the square multiplier 18, and the multiplied results for all sensors are added by the adder 19, which produces the following focus criterion function.

$$F_2 = \sum_{k=1}^{4} (\log(S_{A,K}/S_{B,K}))^2 \quad (3)$$

Also in this case, the $F_2$ takes an extremely small value when the image does not swing depending on the deflection angle of electron beam and, accordingly, when the values of $S_{A,K}$ and $S_{B,K}$ are equal for all sensors.

This embodiment based on the logarithmic process is particularly advantageous for a system having a large number of electron beam sensors. In the previous embodiment of FIG. 1, it is a hard work for the operator to adjust a large number of sensors to provide substantially the same signal gain, whereas in the modified embodiment using a logarithmic operation, signals produced by the same sensor and amplifier are initially subjected to division operation between each other prior to the following process, resulting in an extremely small error caused by the disparity of gain and other characteristics among all sensors.

In the above embodiments of the signal processors 12 and 12A described in connection with FIGS. 1 and 3, their outputs $F_1$ and $F_2$ represent focus criterion functions which take an extremely small value when the electron microscope is finely focused. The objective lens current i which varies the focal length of the lens is controlled to increase or decrease in a step manner by an objective lens current controller 11, and at each step the signal processor 12 or 12A sends its output $F_1$ (or $F_2$) to a microcomputer 22. When the value of $F_1$ (or $F_2$) has reached zero or an extremely small value, the microcomputer 22 operates on the current controller 11 to fix the value of current i, at which condition the electron microscope is exactly in-focus. It is of course possible to implement the objective lens current control manually through the provision of an output indicator 20 which is, for example, a blue lamp lighting up when the $F_1$ (or $F_2$) falls to a minimum value. Upon completion of each setup of the objective lens current, it is indicated to a timing signal generator 21, which then operates on a deflection coil controller 10 to change the electron beam irradiation angle.

In the observation of a low-contrast biological specimen, it is often intended to bring the microscope slightly out of focus so as to superpose the phase contrast of the electron beam on the image for the purpose of enhancing the image contrast. In this case, the objective lens current $i_o$ for the fine focus condition is modified to $i_o-\Delta i$ for observation. The value of $\Delta i$ is determined on a compromise basis between the degree of contrast superposed and the degree of fineness of image affected by the out-focus adjustment, and in this embodiment it is chosen by the observer and preset in the microcomputer 22. Accordingly, the microcomputer 22 determines the value of $i_o$ from the minimum condition of $F_1$ (or $F_2$) and instruct the objective lens current controller 11 to produce the current $i_o-\Delta i$.

According to this invention, as described above, the focus control system uses the integrated signals presenting a satisfactory S/N property to evaluate the focus criterion function which varies sharply in the fine in-focus condition, whereby accurate focusing of the electron microscope is achieved. The inventive focus control system merely needs the change in the electron beam irradiation angle at least once each time the objective lens current is varied, whereby time spent for the focusing operation is minimized. Moreover, the inventive focus control system allows the setup of the electron microscope to an optimal observation condition through the enhancement of image contrast by superposing the phase contrast of electron beam on the image.

We claim:

1. A focusing apparatus used in a transmission electron microscope comprising:
   electron lens means for imaging an electron beam which has transmitted through a specimen onto an imaging plane;
   a plurality of electron beam sensors disposed on said imaging plane;
   deflection means which deflects said electron beam by a predetermined angle for a short time length at least once in each of two directions in response to a change in the lens current of said electron lens means;
   integration means which integrates output signals of said electron beam sensors for a predetermined time length at each deflected irradiation angle of electron beam;
   memory means for storing separately integrated outputs produced by said integration means for each irradiation angle and for each of said electron beam sensors
   arithmetic means which calculates the difference between integrated values stored in said memory means and derived from each electron beam sensor at two irradiation angles and sums up differences of integrated values derived from all electron beam sensors; and
   lens current control means which controls the lens current of said electron lens means so that the summed output of said arithmetic means is a minimum value.

2. A focusing apparatus according to claim 1, wherein said deflection means enables deflection of the electron beam by a predetermined angle for a short time length once in each of two directions.

3. A focusing apparatus according to claim 1, wherein said arithmetic means enables production of a sum of absolute values of differences between each pair of integrated values derived from each electron beam sensor for two irradiation angles and stored in said memory means.

4. A focusing apparatus according to claim 1, wherein said arithmetic means enables production of an output which is calculated in terms of integrated values $S_{A,K}$ and $S_{B,K}$ stored in said memory means and derived from said electron beam sensors of n in number at two irradiation angles A and B as:

$$\sum_{k=1}^{n} (S_{A,K} - S_{B,K})^2.$$

5. A focusing apparatus according to claim 1, wherein said arithmetic means enables production of an output which is calculated in terms of integrated values $S_{A,K}$ and $S_{B,K}$ stored in said memory means and derived from said electron beam sensors of n in number at two irradiation angles A and B as:

$$\sum_{k=1}^{n} \log(S_{A,K}/S_{B,K})^2.$$

6. A focusing apparatus used in a transmission electron microscope comprising:
   electron lens means for imaging an electron beam which has transmitted through a specimen onto an imaging plane;
   a plurality of electron beam sensors disposed on said imaging plane;
   deflection means which deflects said electron beam by a predetermined angle for a short time length at least once in each of two directions in response to a change in the lens current of said electron lens means;
   integration means which integrates output signals of said electron beam sensors for a predetermined time length at each deflected irradiation angle of electron beam;
   memory means for storing separately integrated outputs produced by said integration means for each irradiation angle and for each of said electron beam sensors;
   arithmetic means which calculates the difference between integrated values stored in said memory means and derived from each electron beam sensor at two irradiation angles and sums up differences of integrated values derived from all electron beam sensors; and
   lens current control means which controls the lens current of said electron lens means to a current value that minimizes the output of said arithmetic means subtracted by a small current value.

* * * * *